United States Patent [19]

Umeda

[11] 4,170,760
[45] Oct. 9, 1979

[54] RADIO RECEIVER WITH FREQUENCY SELECTION AND MUTING

[75] Inventor: Kaoru Umeda, Kawasaki, Japan

[73] Assignee: Sony Corporation, Tokyo, Japan

[21] Appl. No.: 910,783

[22] Filed: May 30, 1978

[30] Foreign Application Priority Data

Jun. 4, 1977 [JP] Japan .................................. 52/65997

[51] Int. Cl.² .............................................. H04B 1/10
[52] U.S. Cl. .................................... 325/456; 325/455;
325/464; 325/468; 325/478
[58] Field of Search ................ 325/453, 455, 456, 464,
325/465, 468, 459, 348, 478; 334/86; 358/191,
192; 235/455

[56] References Cited

U.S. PATENT DOCUMENTS

| 3,437,936 | 4/1969 | Tompson | 325/456 |
| 3,835,384 | 9/1974 | Liff | 325/455 |
| 3,962,641 | 6/1976 | Suwa | 325/455 |
| 4,015,253 | 3/1977 | Goldstein | 325/455 |
| 4,122,395 | 10/1978 | Schotz et al. | 325/455 |

Primary Examiner—Robert L. Richardson
Assistant Examiner—Jin F. Ng
Attorney, Agent, or Firm—Lewis H. Eslinger; Alvin Sinderbrand

[57] ABSTRACT

A radio signal receiver having a demodulator circuit with a variable local oscillator is provided with a station selector including a record medium for storing frequency selection information at spaced locations thereon, a conversion circuit for reading the frequency selection information at a selected location by aligning that location with a reading assembly and converting the respective information into a signal for determining the output frequency of the local oscillator, and a signal generating circuit responsive to a lack of alignment of the reading assembly with a location at which frequency selection information is recorded for generating a signal indicating that such lack of alignment exists and which may be effective to cause muting of the output of the demodulator circuit.

16 Claims, 5 Drawing Figures

RADIO RECEIVER WITH FREQUENCY SELECTION AND MUTING

BACKGROUND OF THE INVENTION

1. Field of the Invention

This invention relates generally to radio receivers, and more particularly is directed to an improved station selector for such receivers employing a coded memory for storing reception frequency information.

2. Description of the Prior Art

In radio receivers, and particularly in FM tuners having frequency synthesizers, it has been suggested to use a memory to store information corresponding to the reception frequencies of various stations, and to provide access to the particular information necessary for reception of a selected station. One system of this type uses a tape which is perforated to represent the stored information and which is read by an optical reading assembly. In order to change stations, the position of the perforated tape relative to the reading assembly is changed to select different frequency selection information. When the relative position of the tape and reading assembly is changed for selecting a desired station, the information read by the reading assembly varies irregularly and various uncontrolled signals are demodulated by the receiver. These uncontrolled signals produce offensive noises at the output of the receiver.

OBJECTS AND SUMMARY OF THE INVENTION

Accordingly, it is an object of the present invention to provide a radio receiver with a station selector having a memory to store frequency selection information and which does not suffer from the previously-mentioned disadvantages of the prior art.

More particularly, it is an object of the present invention to provide a radio receiver with a station selector, as aforesaid, and in which the emission of offensive noises is avoided during the changing of the selected frequency information.

It is another object of the invention to provide a radio receiver with a signal generating means for indicating when frequency selection information is being changed.

It is a further object of the invention to provide such a radio signal receiver with a muting means for preventing any output from the receiver when frequency selection information is being changed.

In accordance with an aspect of this invention, a radio signal receiver having a demodulation means including a controllable local oscillator and a mixer for demodulating a radio signal in response to the output of the local oscillator includes a control means comprising a reading assembly having a light source and a plurality of light sensitive elements each adapted to receive light produced by the light source, a record medium disposed to influence the light passing from the light source to the light sensitive elements and being generally of a material adapted to allow a predetermined first amount of light to pass from the light source to the light sensitive elements, the record medium having coded frequency selection information recorded thereon at successive locations in the form of respective groupings of spots each adapted to allow a predetermined second amount of light to pass from the light source to a respective one of the light sensitive elements when the respective groupings of spots is aligned with the reading assembly, each of the spots further allowing a respective one of the light sensitive elements to receive an amount of light intermediate the first and second amounts when the respective grouping of spots is not in proper alignment with the reading assembly, means for moving the record medium relative to the reading assembly in the direction in which the groupings of spots are successively arranged, thereby to selectively align the groupings with the reading assembly, means responsive to the reception of the second amount of light at least one of the light sensitive elements when a selected one of the groupings is aligned with the reading assembly for controlling the local oscillator in correspondence with the coded frequency selection information represented by the one selected grouping, and means responsive to the reception of the intermediate amount of light by at least one of the light sensitive elements for providing a signal indicating a lack of alignment of any one of the groupings of spots with the reading assembly.

In accordance with a feature of the present invention, a muting means for muting the output of the demodulation means is made operative in response to the signal indicating a lack of alignment of any one of the groupings of spots with the reading assembly.

In accordance with another feature of the present invention, the light source is powered by alternating current for producing light having a varying component corresponding to the variations of the current and each of the light sensitive elements operates in a saturated region when receiving said second amount of light and in an active region to show said varying component in its output only when receiving said intermediate amount of light, and the indicating signal is produced in response to the varying component in the output of any one of the light sensitive elements.

DETAILED DESCRIPTION OF A PREFERRED EMBODIMENT

Figure 1:
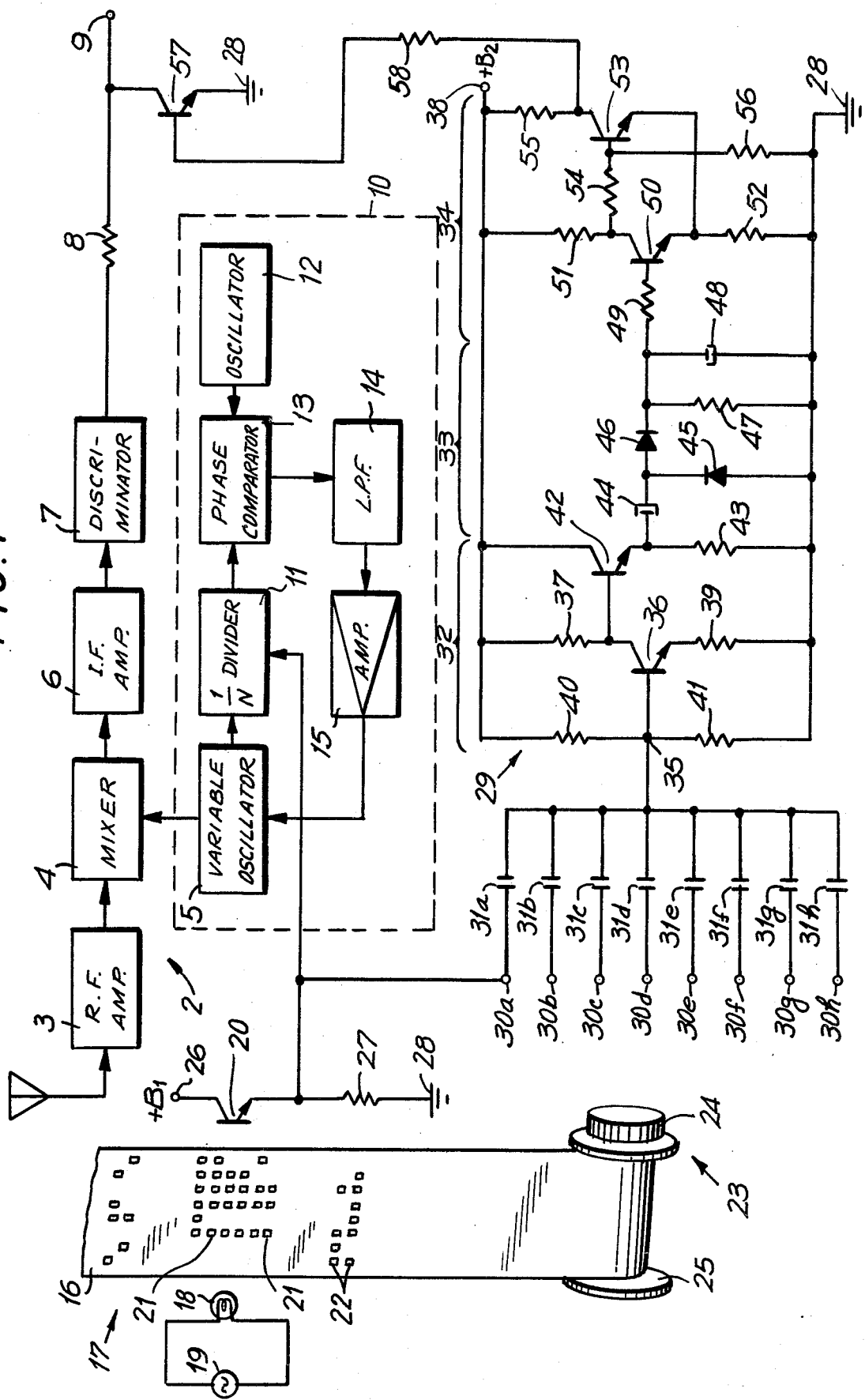
FIG. 1 is a circuit diagram showing a radio receiver according to one embodiment of the present invention.

Referring in detail to FIG. 1, it will be seen that the "front end" of a radio receiver to which this invention is applied is shown to include an antenna 1 connected to an RF amplifier 3 for amplifying signals received from the antenna at least in the frequency range of the tuner or receiver. A demodulating means 2 is shown to include a mixer 4 connected to the output of RF amplifier 3 for demodulating the output thereof in response to the output from a variable or voltage controlled oscillator 5. An intermediate frequency amplifier 6 and an FM discriminator 7 are connected in series to the output of mixer 4 and further process the carrier frequency demodulated signal for output through a resistor 8 to an output terminal 9.

In the illustrated frequency synthesizer, the demodulation frequency generated by the variable oscillator 5 for the mixer 4 is controlled by a phase locked loop 10. The loop 10 includes a variable divider 11 connected to the variable oscillator 5 for also receiving the demodulation frequency generated thereby. The loop 10 also includes a phase comparator 13 which has first and second inputs receiving the outputs of divider 11 and a fixed frequency oscillator 12, respectively. A low-pass filter 14 and an amplifier 15 are connected in series to the output of phase comparator 13 for supplying a control signal or voltage to variable oscillator 5.

A frequency selection signal originates from a record medium 16 having coded frequency selection information recorded thereon. The record medium 16 is read by a reading assembly 17 including a light source or lamp 18 energized by a power source 19 and a plurality of light sensitive elements 20 only one of which appears on FIG. 1 and each of which is adapted to receive light produced by light source 18. In the illustrated embodiment of the invention, the power source 19 provides alternating current for the lamp or light source 18 so that the light emitted by the latter has a varying component.

In one embodiment of this invention, the frequency selection information is in binary coded form, having eight bits of information for each coded frequency selection, and there is one light sensitive element 20 for each bit of information.

The frequency selection information stored on record medium 16 is readable by the reading assembly 17 by reason of the fact that record medium 16 is disposed to influence the light passing from the light source 18 to the light sensitive elements 20. The record medium 16 is generally of a material adapted to allow a predetermined first amount of light to reach each light sensitive element 20. In the illustrated embodiment of the invention, the record medium 16 is disposed between the light source 18 and the light sensitive elements 20 and any light passing therebetween has to pass through the record medium 16.

The frequency selection information on record medium 16 is in the form of groupings 21 of spots 22 at successively arranged or spaced apart locations on the record medium. Each spot 22 is adapted to allow a predetermined second amount of light to pass from the light source 18 to a respective one of the light sensitive elements 20, when the respective grouping 21 of spots is aligned with the reading assembly 17.

In the embodiment in which the frequency selection information is in binary coded form, the presence of a spot 22 at any one of the bit locations in a grouping 21 is used to represent one of the binary states ("0" or "1") and the lack of a spot at the bit location is used to represent the other binary state.

By way of example, the record medium 16 may be opaque and the spots 22 may be constituted by perforations in the record medium 16. In such example, the predetermined first amount of light which the record medium 16 allows to reach a light sensitive element 20 when no one of the spots or perforations 22 is aligned or registered with the respective element 20 is minimal or nil, and the predetermined second amount of light allowed to reach a light sensitive element 20 through a perforation or spot 22 is the maximum permissible with a given light source 18.

In order to allow any selected one of the groupings 21 of spots 22 to be aligned with reading assembly 17, actuating means 23 are provided for moving the record medium 16 relative to the reading assembly 17 in the direction in which groupings 21 are spaced apart or successively arranged on the record medium 16. As shown, the record medium 16 may be in the form of an elongated tape and the actuaging means 23 may be constituted by a manually rotatable knob 24 coupled with a spool 25 which engages the tape, as by winding the latter thereon, for advancing the tape longitudinally in response to turning of the knob 24. A similar knob and spool (not shown), or any other suitable arrangement, may be provided for moving the record medium or tape 16 in the opposite direction. Further, a pointer or indicator (not shown) may also be moved along a dial or scale in response to rotation of knob 24 for indicating the station to which the radio receiver is tuned.

In the embodiment of FIG. 1, the light sensitive elements 20 are photo-transistors arranged in a row transversely across the record tape 16 and each having one lead connected to a power source terminal 26 and a second lead connected through a resistor 27 to ground 28. Output voltages are produced by the currents flowing through the light sensitive elements 20 and are available, with respect to ground, at the connections of the respective light sensitive elements 20 to their respective resistors 27, and each of these output voltages is applied separately to the frequency divider 11 of phase locked loop 10. Thus, the divisor applied by frequency divider 11 to the output of variable oscillator 5 is determined by the outputs of elements 20.

In the described embodiment, a circuit 29 also receives the output voltages of the light sensitive elements 20 at terminals 30a–30h which are connected through parallel capacitors 31a–31h, respectively, to an input 35 of a limiter amplifier 32.

The circuit 29 further generally includes a detector circuit 33 and a switching or Schmitt circuit 34. The common connection of capacitors 31a–31h to input terminal 35 is connected to limiter amplifier 32 at the base of a transistor 36. The collector of transistor 36 is connected through a resistor 37 to a power supply terminal 38 and the emitter of transistor 36 is connected to ground 28 through a resistor 39. A voltage divider circuit including resistors 40 and 41 is connected between power supply terminal 38 and ground forms a biasing circuit for the transistor 36 by having the base of the latter connected to the junction between resistors 40 and 41. Another transistor 42 has its base connected to the collector of transistor 36, while the collector of transistor 42 is connected to the power supply terminal 38 and its emitter is connected through a resistor 43 to ground 28.

The detecting circuit 33 is shown to include a capacitor 44, one lead of which is connected to the emitter of transistor 42 and the other lead of which is connected to the cathode of a diode 45 and the anode of a diode 46. The anode of diode 45 is connected to ground 28, and the cathode of diode 46 is connected through a resistor 47 and through a parallel capacitor 48 to ground 28. The cathode of diode 46 is further connected through a resistor 49 to the base of a transistor 50 which is part of the switching or Schmitt circuit 34. The collector of transistor 50 is connected through a resistor 51 to supply terminal 38 and the emitter of transistor 50 is connected through a resistor 52 to ground 28. Another transistor 53 in the switching circuit 34 has its base connected through a resistor 54 to the collector of transistor 50, while the emitter of transistor 53 is connected directly to the emitter of transistor 50 and the collector of transistor 53 is connected through a resistor 55 to supply terminal 38. A resistor 56 is connected between the base of transistor 53 and ground 28.

In order to mute the output of the illustrated video receiver during changing of the station to be received, a transistor 57 has its collector-emitter junction connected across the output of the demodulator means 2.

More particularly, as shown, the collector and emitter of transistor 57 are connected to output terminal 9 and to ground 28, respectively, and the base of transistor 57 is connected through a resistor 58 to the collector of transistor 53.

The above described radio receiving embodying this invention operates in the following manner:

A radio frequency signal is received by antenna 1 and amplified by RF amplifier 3. The mixer 4 demodulates the amplified signal in response to a carrier frequency generated by variable oscillator 5. The IF amplifier 6 and discriminator 7 further process the carrier frequency demodulated signal for output at the terminal 9.

The frequency generated by the variable oscillator is controlled by the phase locked loop 10. For this purpose, the carrier frequency output of the oscillator 5 is divided by a variable divisor N in the variable divider 11 controlled by the frequency selection information on record medium or tape 16. The resulting frequency is compared in phase comparator 13 with a fixed frequency signal from oscillator 12, which, for example, may have a frequency of 100 KHz. The output of comparator 13 is processed by low pass filter 14 and amplifier 15 and returned to the variable oscillator 5 as a control voltage for controlling the oscillation frequency thereof. When the output of oscillator 5 is at the desired frequency, the output of divider 11 equals the reference frequency from oscillator 13 and the signal to variable oscillator 5 holds the output thereof at the desired frequency. Moreover, the frequency selection information recorded on the record medium 16 determines the divisor N of the divider 11 and thereby determines the frequency of the variable oscillator 5 which, in turn, establishes the station or frequency to which the radio receiver is tuned.

To select the desired frequency information stored on the record medium 16, the medium is moved by means 23 to align a selected grouping 21 of spots representing coded information corresponding to the desired frequency, between light source 18 and the plurality of light sensitive elements 20. The amount of light falling on each light sensitive element depends upon whether or not there is a spot 22 disposed between that element and the light source 18. If no spot is so disposed, a predetermined first amount of light from the light source 18 will reach the light sensitive element 20. If a spot 22 is disposed between the light source and element 20, a predetermined second amount of light will reach the light sensitive element 20. In the particular embodiment where the record medium 16 is relatively opaque and the spots are in the form of perforations therein and a photo-transistor is used for each light sensitive element 20, the amount of current which will flow through the element 20 in response to the first amount of light may be little or nothing and the amount of current which will flow through the element 20 in response to the second amount of light may be sufficient to operate the light sensitive element 20 at its maximum current flow or saturation level.

Figure 2A:
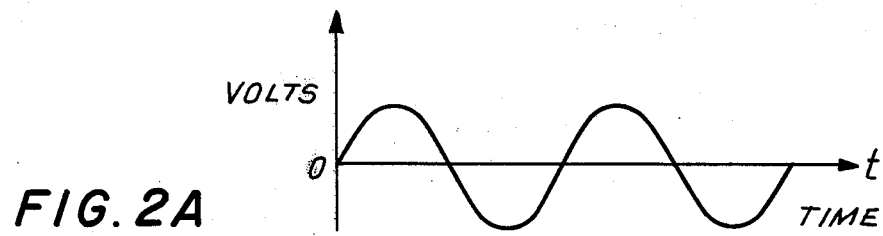
FIGS. 2A to 2D are waveform diagrams to which reference will be made in describing the operation of the circuit of FIG. 1.
Figure 2B:
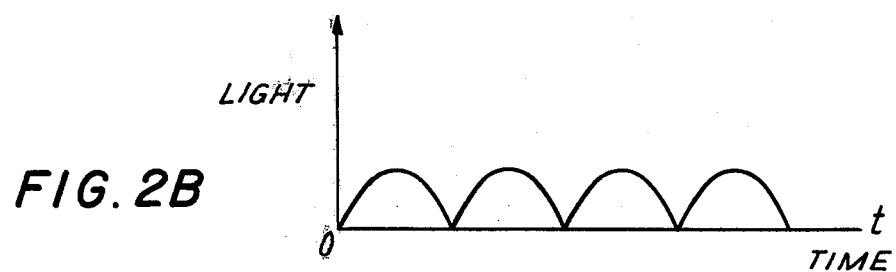
Figure 2C:
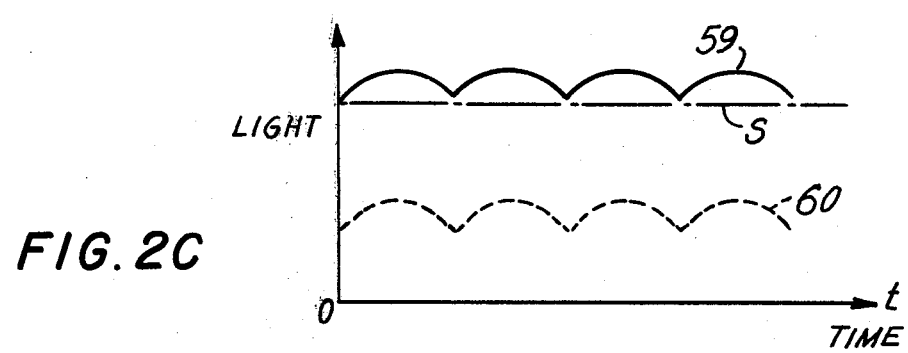

When the power source 19 for the lamp 18 provides an alternating current (FIG. 2A), the light produced by lamp 18 has a varying component corresponding to the variations in the current, for example, as shown on FIG. 2B. In the illustrated embodiment of the invention, the amount of light which is allowed to reach a light sensitive element 20 when a spot 22 is disposed between that element 20 and the light source 18 is sufficient to operate the element 20 in a region of saturation regardless of the varying component of the light level corresponding to the variations in current, for example, as shown on FIG. 2C, where the line S represents the level of saturation of a light sensitive element 20 and the curve 59 represents the amount of light actually reaching the light sensitive element.

Thus, when a spot 22 is disposed in alignment with a light sensitive element 20, a maximum level of constant current flows therethrough and creates a maximum constant voltage level across the respective resistor 27. When a spot 22 is not disposed in even imperfect alignment with a light sensitive element 20, the opaque record medium 16 blocks the passage of light from source 18 to such element 20, and a minimum amount of constant current flows through element 20 for creating a minimum constant voltage across the respective resistor 27. Thus, the voltage generated across each resistor 27 represents the logic level of the binary bit corresponding to the respective light sensitive element 20. The logic levels from all of the elements 20 are received by the divider 11 to determine the divisor N thereof.

When a grouping 21 of spots 22 is aligned with reading assembly 17, each of the light sensitive elements 20 has either a transparent spot or perforation 22 or the opaque record medium aligned between it and the light source 18. Thus, each light sensitive element 20 has either no current or a saturation current flowing therethrough. Under these conditions, even though an alternating current power source 19 is being used for the light source 18, the voltages produced across the resistors 27 do not have AC components therein. As the capacitors 31a–31h block DC voltages from reaching limiter amplifier 32, no signal is applied to the input 35 thereof. For this reason, the voltage across resistor 43 is a constant DC voltage, which is prevented from affecting the detector circuit 33 by capacitor 44. Any voltage across capacitor 48 is discharged through the resistor 47 and transistor 50 remains non-conducting. Therefore, the base of transistor 53 receives a positive voltage through the divider constituted by resistors 51, 54 and 56 which causes the transistor 53 to be conductive. When transistor 53 is conductive, the low collector-emitter voltage thereacross reduces the voltage available to the base of transistor 57 causing the latter transistor to be non-conductive. Accordingly, when the record medium 16 is positioned to align one of its groupings 21 of spots or perforations 22 with the reading assembly 17, the muting transistor 57 remains non-conductive, and the output of the demodulation means 2 is allowed to pass to the output terminal 9.

Figure 2D:
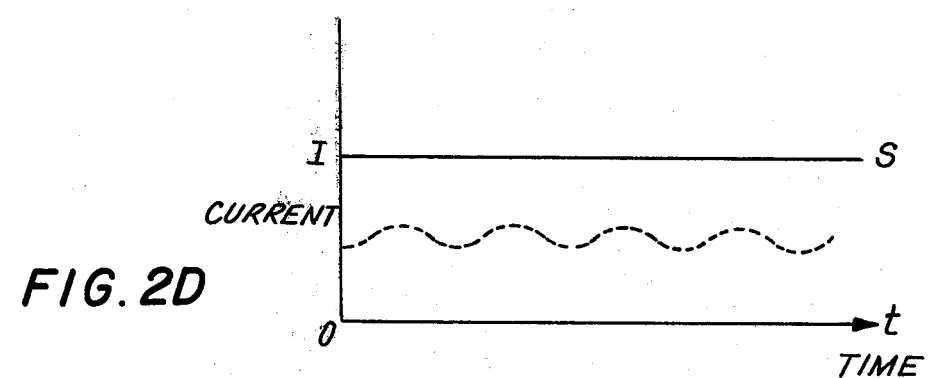

When the means 23 are operated for changing the frequency selection information presented to the reading assembly 17 or when a selected grouping is not in proper alignment with the relative assembly 17, the spots or perforations 22 which are only partially registered with light sensitive elements 20 cause the light reaching the respective light sensitive elements 20 to be intermediate the predetermined second amount of light and the predetermined first amount of light. In other words, one or more of the spots or perforations 22 may allow a respective one of the light sensitive elements 20 to receive an amount of light intermediate the maximum and minimum amounts when the respective grouping 21 of spots or perforations is moving to or from alignment with the reading assembly 17 or is not actually or precisely aligned therewith. Due to the intermediate amount of light reaching one or more of the light sensitive elements 20, at least one of the elements 20 will operate in its active current region. In other words, the varying component in the level of light represented by the curve 60 on FIG. 2G will cause a varying current in the particular light sensitive element 20, for example, as shown by the curve 61 on FIG. 2D. This varying current 61 will produce an appropriate AC component in the voltage across the respective resistor 27, and such AC component will be applied, by way of the respective one of the capacitors 31a–31h to the input 35 of amplifier 32 and will appear across resistor 43 as an AC voltage. This AC voltage is transmitted through capacitor 44 and is half-wave rectified by diode 46. The resulting voltage charges capacitor 48 to a level sufficient to turn on transistor 50, whereupon, the voltage drop across the collector-emitter junction of transistor 50 reduces the emitter-base bias voltage of transistor 53, thereby causing the latter transistor to turn off. As a result, the B+ voltage at terminal 38 is applied through current limiting resistors 55 and 58 to the base of muting transistor 57 so that the latter is made conductive and shorts the output of the demodulator means 2 to ground 28. Thus, due to the operation of any one of the light sensitive elements 20 in its active region in response to the lack of alignment of a grouping with the reading assembly 17, the muting circuit formed by transistor 57 is made operative for excluding any stray or unwanted signals or noise from the output at terminal 9.

In the illustrated embodiment of the present invention, adjacent groupings 21 of the spots representing frequency selection information are sufficiently close together to allow the partial exposure to light from source 18 of at least one of the light sensitive elements 20 by a spot of perforation 22 of one or the other of two adjacent groupings whenever the tape 16 is being moved to or from a position of accurate alignment of a selected grouping 21 with the elements 20. Therefore, a continuous signal is applied to the base of muting transistor 57 if, in the course of moving tape 16, the latter is left in a position where no one of its groupings 21 of perforations is accurately aligned with the elements 20.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. In a radio receiver having demodulation means including a controllable local oscillator and a mixer for demodulating a radio signal in response to the output of said local oscillator, a control means comprising:
   a reading assembly including a light source, and a plurality of light sensitive elements each adapted to receive light produced by said light source;
   a record medium disposed to influence the light passing from said source to said light sensitive elements and being generally of a material adapted to allow a predetermined first amount of light to pass from said source to said light sensitive elements, said record medium having coded frequency selection information recorded thereon at successive locations in the form of respective groupings of spots each adapted to allow a predetermined second amount of light to pass from said source to a respective one of said light sensitive elements when the respective grouping of spots is aligned with said reading assembly, each of said spots further allowing a respective one of said light sensitive elements to receive an amount of light intermediate said first and second amounts when the respective grouping of spots is not in proper alignment with said reading assembly;
   means for moving said record medium relative to said reading assembly in the direction in which said groupings of spots are successively arranged, thereby to selectively align said groupings with said reading assembly;
   means responsive to the reception of said second amount of light by at least one of said light sensitive elements when a selected one of said groupings is aligned with said reading assembly for controlling said local oscillator in correspondence with the coded frequency selection information represented by said one selected grouping;
   means responsive to the reception of said intermediate amount of light by at least one of said light sensitive elements for providing an indicating signal indicating the lack of proper alignment of any one of said groupings of spots with said reading assembly; and muting means for muting the output of said demodulation means in response to said signal indicating a lack of alignment of any one of said groupings of spots with said reading assembly.

2. A radio receiver according to claim 1; wherein said means for providing said indicating signal is operative when said record medium is being moved from a position of alignment of one of said groupings of spots with said reading assembly to the position of alignment of the next adjacent grouping of spots with the reading assembly.

3. A radio receiver according to claim 1; wherein said light source is powered by alternating current for producing light having a varying component corresponding to the variations of said alternating current, and further wherein each of said light sensitive elements is adapted to vary the amount of current passing therethrough between a constant minimum current region, an active varying current region and a constant maximum current region in response to the amount of light received thereby.

4. A radio receiver according to claim 3; wherein each said light sensitive element is adapted to operate in said constant maximum current region in response to receiving said second amount of light regardless of said varying component of said light.

5. A radio receiver according to claim 4; wherein each said light sensitive element is adapted to operate in said constant minimum current region in response to receiving said first amount of light regardless of said varying component of said light.

6. A radio receiver according to claim 5; wherein each said light sensitive element is adapted to operate in said active varying current region and having a varying current component corresponding to the varying component of said light when receiving an amount of light from said light source between said first and second amounts, and further wherein said means for providing said signal indicating lack of proper alignment is responsive to said varying current component of any one of said light sensitive elements.

7. A radio receiver according to claim 6; wherein said means for providing the indicating signal includes amplifier means for amplifying said varying current component, detecting circuit means for detecting the presence of the amplified varying current component at the output of said amplifier, and means providing said indicating signal in response to the detected presence of said amplified varying current component.

8. A radio receiver according to claim 7; wherein said muting means includes a transistor operable by said indicating signal and having its emitter-ccollector junction connected across the output of said demodulation means.

9. A radio receiver according to claim 6; wherein adjacent groupings of spots on said record medium are disposed sufficiently close to each other to provide the generation of said indicating signal continuously when moving said record medium between successive alignments of said adjacent spot groupings with said reading assembly.

10. A radio receiver according to claim 1; wherein said record medium comprises an elongated tape.

11. A radio receiver according to claim 10; wherein said elongated tape is mounted for lateral movement and said respective groupings of spots are laterally disposed on said tape.

12. A radio receiver according to claim 1; further comprising a variable frequency divider for dividing the output frequency of said controllable oscillator and having a variable divisor;

means for varying said divisor in response to the coded frequency selection information indicated by various of said groupings of spots selectively aligned with said light sensitive elements for selective exposure of the latter to said second amount of light;

a fixed frequency oscillator for generating a reference frequency;

a phase comparator for comparing the output of said frequency divider with said reference frequency; and means for providing a control signal to said controllable oscillator in response to the output of said phase comparator.

13. A radio receiver according to claim 1; wherein said light source is powered by alternating current for producing light having a varying component corresponding to the variations of said alternating current, and further wherein each of said light sensitive elements is adapted to vary the amount of current passing therethrough between a constant minimum current region, an active varying current region and a constant maximum current region in response to the amount of light received thereby.

14. A radio receiver according to claim 13; wherein each of said light sensitive elements is adapted to operate in said constant maximum current region in response to receiving said second amount of light regardless of said varying component of said light.

15. A radio receiver according to claim 14; wherein each of said light sensitive elements is adapted to operate in said constant minimum current region in response to receiving said first amount of light regardless of said varying component of said light.

16. A radio receiver according to claim 15; wherein each of said light sensitive elements is adapted to operate in said active varying current region and to have a varying current component corresponding to the varying component of said light when receiving an amount of light from said light source between said first and second amounts, and further wherein said means for providing the indicating signal is responsive to said varying current component of any one of said light sensitive elements.

* * * * *